United States Patent
Kim et al.

(10) Patent No.: US 8,036,062 B2
(45) Date of Patent: Oct. 11, 2011

(54) SEMICONDUCTOR MEMORY DEVICE AND METHOD FOR DRIVING THE SAME

(75) Inventors: Kyoung-Nam Kim, Kyoungki-do (KR); Yoon-Jae Shin, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 29 days.

(21) Appl. No.: 12/724,088

(22) Filed: Mar. 15, 2010

(65) Prior Publication Data

US 2010/0165761 A1    Jul. 1, 2010

Related U.S. Application Data

(62) Division of application No. 11/819,803, filed on Jun. 29, 2007, now Pat. No. 7,710,817.

(30) Foreign Application Priority Data

Jan. 10, 2007  (KR) .............................. 2007-0002896

(51) Int. Cl.
*G11C 8/00* (2006.01)

(52) U.S. Cl. ......................... 365/233; 365/193; 365/194

(58) Field of Classification Search ................. 365/233, 365/193, 194

See application file for complete search history.

(56) References Cited

U.S. PATENT DOCUMENTS

| 7,038,971 | B2 | 5/2006 | Chung | |
| 7,652,937 | B2* | 1/2010 | Searles et al. | 365/193 |
| 7,697,370 | B2* | 4/2010 | Choi | 365/233.12 |
| 2001/0030903 | A1 | 10/2001 | Kuge et al. | |
| 2004/0052152 | A1 | 3/2004 | Kono | |
| 2009/0257294 | A1* | 10/2009 | Searles et al. | 365/193 |
| 2010/0135100 | A1* | 6/2010 | Chiu | 365/233.11 |
| 2010/0208535 | A1 | 8/2010 | Fujisawa | |
| 2010/0271886 | A1 | 10/2010 | Park et al. | |
| 2011/0002181 | A1* | 1/2011 | Rhee et al. | 365/194 |

* cited by examiner

*Primary Examiner* — Tuan T. Nguyen
(74) *Attorney, Agent, or Firm* — IP & T Group LLP

(57) ABSTRACT

A semiconductor memory device includes: a modulation controller for generating a modulation control signal for controlling a frequency modulation operation; a delay locked loop (DLL) circuit for performing a delay locking operation to generate first and second DLL clocks and outputting a frequency-modulated DLL clock in response to the modulation control signal; and a data strobe signal generator for outputting the frequency-modulated DLL clock as a data strobe signal.

9 Claims, 8 Drawing Sheets

FIG. 3
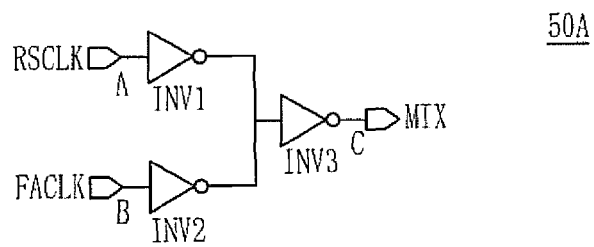
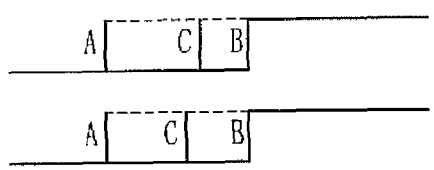
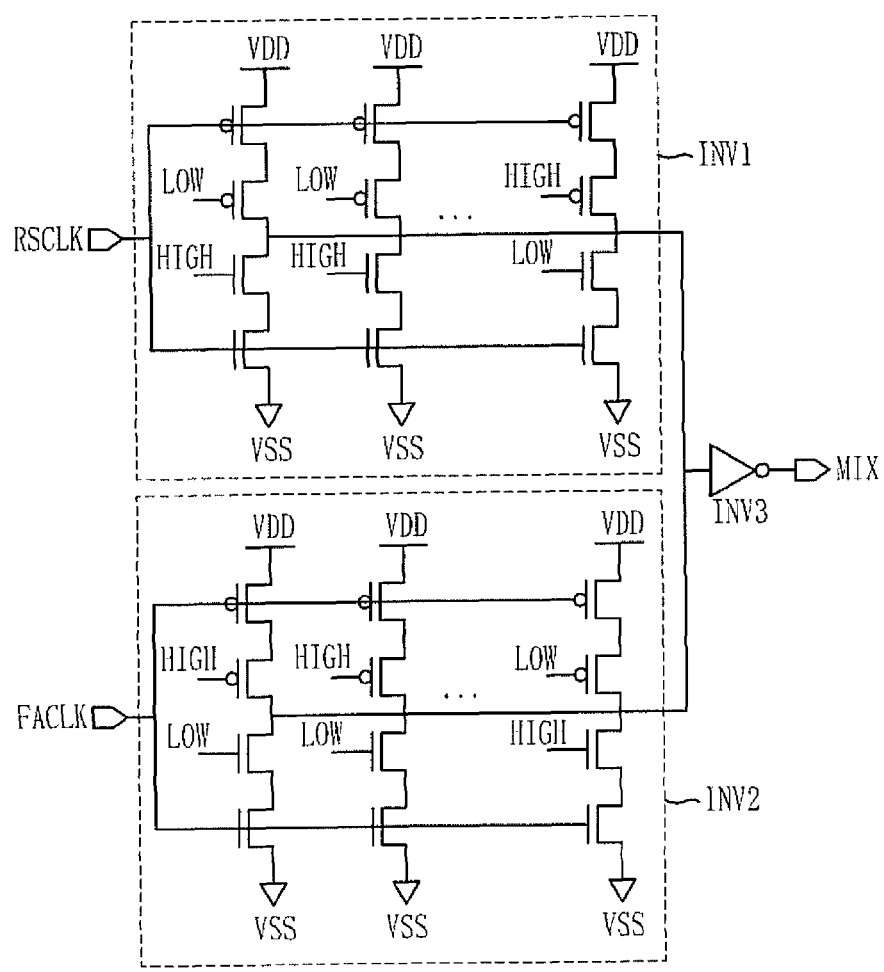

SEMICONDUCTOR MEMORY DEVICE AND METHOD FOR DRIVING THE SAME

CROSS-REFERENCE TO RELATED APPLICATIONS

This application is a division of U.S. patent application Ser. No. 11/819,803 filed on Jun. 29, 2007 now U.S. Pat. No. 7,710,817, which claims priority of Korean patent application number 10-2007-0002896 filed on Jan. 10, 2007. The disclosure of each of the foregoing applications is incorporated herein by reference in its entirety. The present invention claims priority of incorporated by reference in its entirety.

BACKGROUND OF THE INVENTION

The present invention relates to a semiconductor memory device, and more particularly, to a delay locked loop (DLL) of a semiconductor memory device.

A system is implemented with a plurality of semiconductor devices. Among them, a semiconductor memory device is used to store data. The semiconductor memory device outputs data corresponding to addresses received from a data processor, e.g., a central processing unit (CPU), or stores data received from a data processor on unit cells corresponding to addresses inputted together with the data.

As the operating speed of the system increases, the data processor requires the semiconductor memory device to input/output data at a high speed. As semiconductor integrated circuit (IC) technologies rapidly develops, the operating speed of the data processor increases, but the data input/output speed of the semiconductor memory device does not keep up with the increased operating speed of the data processor.

Many attempts have been made to develop semiconductor memory devices that can increase data input/output speed up to the level required by the data processor. One of these semiconductor memory devices is a synchronous memory device that outputs data at each period of a system clock. Specifically, the synchronous memory device outputs or receives data to or from the data processor in synchronization with the system clock. However, because even the synchronous memory device could not keep up with the operating speed of the data processor, a double data rate (DDR) synchronous memory device was developed. The DDR synchronous memory device outputs or receives data at each transition of the system clock. That is, the DDR synchronous memory device outputs or receives data in synchronization with falling edges and rising edges of the system clock.

However, the system clock necessarily has a predetermined delay time until it arrives at a data output circuit because it passes through a clock input buffer, a transfer line, etc. Thus, if the data output circuit outputs data in synchronization with the delayed system clock, an external device will receive data that are not synchronized with rising edges (rising transitions) and falling edges (falling transitions) of the system clock.

To solve this problem, the semiconductor memory device uses a delay locked loop (DLL) circuit to lock a delay of a clock signal. The DLL circuit compensates for the delay caused by internal circuits of the semiconductor memory device until the system clock input to the semiconductor memory device is transferred to the data output circuit. The DLL circuit finds the delay time of the system clock, which is caused by the clock input buffer, the clock transfer line, etc. of the semiconductor memory device. Then, the DLL circuit delays the system clock by the found delay time and outputs the delayed system clock to the data output circuit. That is, the DLL circuit outputs the delay-locked system clock to the data output circuit. The data output circuit outputs data in synchronization with the delay-locked system clock. Therefore, it seems that the data are correctly output to the external circuit in synchronization with the system clock.

In an actual operation, the delay-locked system clock is transferred to the output buffer at a point in time earlier by one period than a point in time when the data must be outputted, and the output buffer outputs data in synchronization with the received delay locked clock. Therefore, the data is outputted faster than the delay of the system clock caused by the internal circuit of the semiconductor memory device. In this way, it seems that the data are correctly outputted in synchronization with the rising and falling edges of the system clock input to the semiconductor memory device. That is, the DLL circuit is a circuit to find how fast the data must be outputted in order to compensate for the delay of the system clock within the semiconductor memory device.

A data input device can receive data accurately synchronized with the system clock when the data is outputted in synchronization with the delay locked clock output from the DLL circuit. However, since the delay locked clock always has a constant frequency, an electromagnetic interference (EMI) characteristic may be degraded during the data transfer process. That is, the EMI characteristic may be degraded when a clock frequency used for data transfer between the semiconductor memory device and the data processor is fixed to a single frequency. To solve this problem, the system with the semiconductor memory device is designed to have a spread spectrum clock (SSC) function. The SSC function is to spread a power spectrum by modulating a clock received from the semiconductor memory device. However, when the SSC function of the system is operated incorrectly, the EMI characteristic is degraded because the power spectrum output from the semiconductor memory device has a single peak.

SUMMARY OF THE INVENTION

Embodiments of the present invention are directed to providing a semiconductor memory device that can modulate an output clock so as to prevent degradation in an EMI characteristic of a system with the semiconductor memory device.

Another embodiments of the present invention are directed to providing a semiconductor memory device having a DLL circuit that can modulate an output clock.

Further another embodiments of the present invention are directed to providing a semiconductor memory device that can modulate an output clock by controlling an output clock of a circuit for correcting a duty ratio of a delay locked clock.

In accordance with the first aspect of the present invention, there is provided a semiconductor memory device, including: a modulation controller for generating a modulation control signal for controlling a frequency modulation operation; a delay locked loop (DLL) circuit for performing a delay locking operation to generate first and second DLL clocks and outputting a frequency-modulated DLL clock in response to the modulation control signal; and a data strobe signal generator for outputting the frequency-modulated DLL clock as a data strobe signal.

In accordance with the second aspect of the present invention, there is provided a method for driving a semiconductor memory device, including: generating a frequency modulation control signal; performing a delay locking operation to generate a delay locked loop (DLL) clock modulated in response to the frequency modulation control signal; and outputting the modulated DLL clock as a data strobe signal.

In accordance with the third aspect of the present invention, there is provided a semiconductor memory device, including: a delay locked loop (DLL) circuit for performing a delay locking operation to generate a DLL clock; a modulation controller for generating a modulation control signal for controlling a frequency modulation operation; a duty corrector for correcting a duty ratio of the DLL clock and outputting the DLL clock modulated in response to the modulation control signal; and a data strobe signal generator for outputting the modulated DLL clock as a data strobe signal.

In accordance with the fourth aspect of the present invention, there is provided a method for driving a semiconductor memory device, including: performing a delay locking operation to generate a delay locked loop (DLL) clock; generating a frequency modulation control signal; correcting a duty ratio of the DLL clock and frequency-modulating the DLL clock in response to the frequency modulation control signal; and outputting the modulated DLL clock as a data strobe signal.

In accordance with the fifth aspect of the present invention, there is provided a semiconductor memory device, including: a delay locked loop (DLL) circuit for performing a delay locking operation to generate a DLL clock; a modulation controller for generating a modulation control signal for controlling a frequency modulation operation; a clock output circuit for outputting a modulated clock under the control of the modulation controller; and a data strobe signal generator for outputting the modulated DLL clock as a data strobe signal.

In accordance with the sixth aspect of the present invention, there is provided a method for driving a semiconductor memory device, including: performing a delay locking operation to generate a delay locked loop (DLL) clock; generating a frequency modulation control signal; frequency-modulating the DLL clock in response to the frequency modulation control signal; and outputting the frequency-modulated clock as a data strobe signal.

BRIEF DESCRIPTION OF THE DRAWINGS

FIG. 3 is a circuit diagram of a duty correction mixer shown in FIG. 1;

DESCRIPTION OF SPECIFIC EMBODIMENTS

Hereinafter, a semiconductor memory device for modulating an output clock so as to prevent degradation in an EMI characteristic of a system with the semiconductor memory device in accordance with exemplary embodiments of the present invention will be described in detail with reference to the accompanying drawings.

Figure 1:
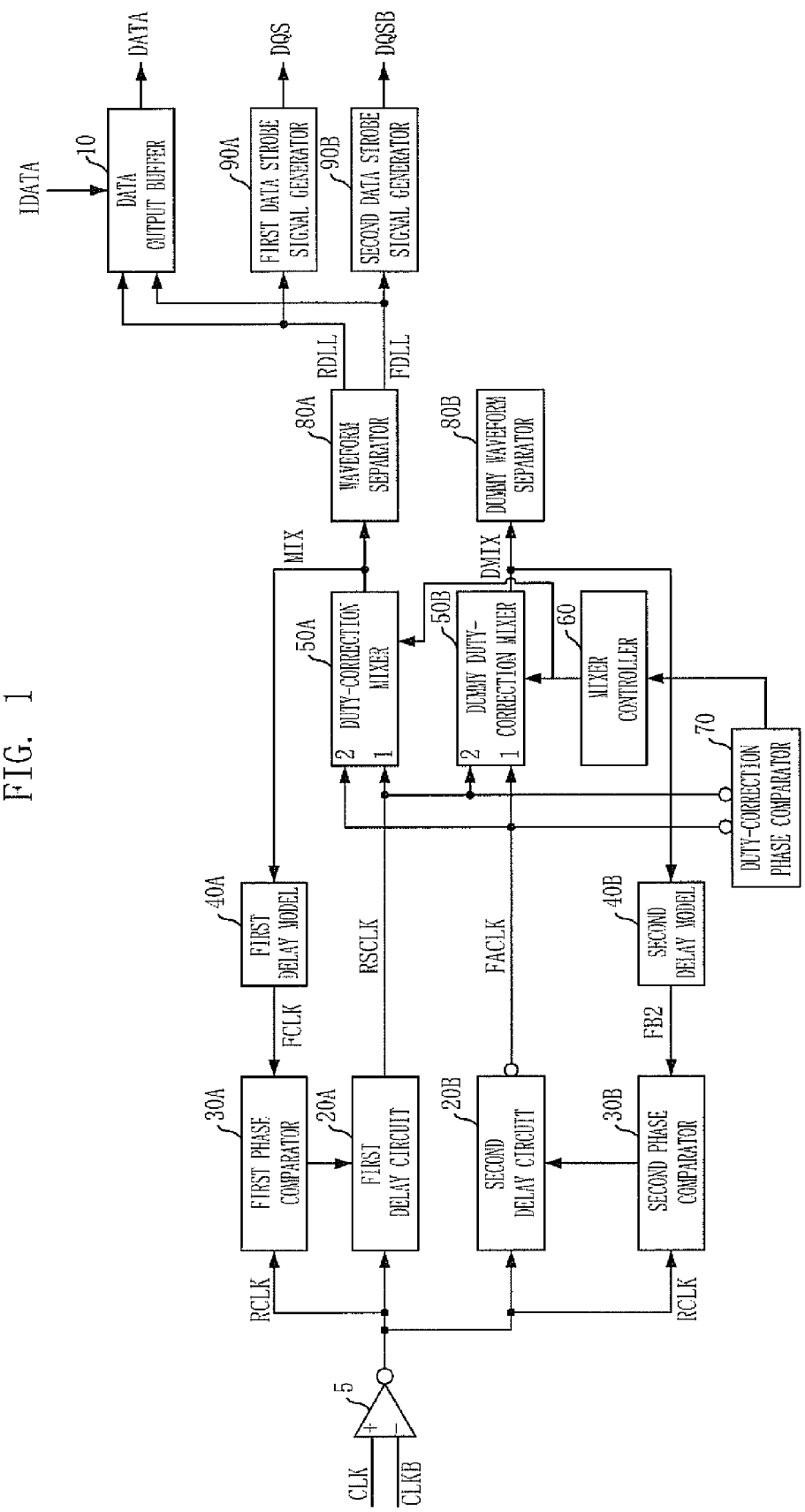
FIG. 1 is a block diagram of a semiconductor memory device.

FIG. 1 is a block diagram of a semiconductor memory device with a delay locked loop (DLL) circuit.

Referring to FIG. 1, the semiconductor memory device includes a clock input buffer 5, a first delay circuit 20A, a second delay circuit 20B, a first phase comparator 30A, a second comparator 30B, a first delay model 40A, a second delay model 40B, a duty-correction mixer 50A, a dummy duty-correction mixer 50B, a mixer controller 60, a duty-correction phase comparator 70, a waveform separator 80A, a dummy waveform separator 80B, a first data strobe signal generator 90A, a second data strobe signal generator 90B, and a data output buffer 10.

The clock input buffer 5 buffers external system clocks CLK and CLKB to output a reference clock RCLK. The first delay circuit 20A delays the reference clock RCLK by a predetermined delay value to output a rising clock RSCLK. The second delay circuit 20B delays the reference clock RCLK by a predetermined delay value and inverts the delayed reference clock to output a falling clock FACLK. The duty-correction mixer 50A mixes the rising clock RSCLK with the falling clock FACLK to output a mixing clock MIX. The dummy duty-correction mixer 50B mixes the rising clock RSCLK with the falling clock FACLK to output a dummy mixing clock DMIX. The duty-correction phase comparator 70 compares a duty ratio of the rising clock RSCLK with a duty ratio of the falling clock FACLK to output a corresponding control signal to the mixer controller 60. The mixer controller 60 controls the correction of the duty ratios of the mixing clock MIX and the dummy mixing clock DMIX in response to the control signal output from the dummy duty-correction phase comparator 70.

The first delay model 40A outputs a first feedback clock FCLK produced by delaying the mixing clock MIX by a model delay value. The second delay model 40B outputs a second feedback clock FB2 produced by delaying the dummy mixing clock DMIX by a model delay value. The model delay value is obtained by modeling a delay time taken to transfer the system clock to the data output circuit after the system clock is inputted to the semiconductor memory device. The first phase comparator 30A compares a phase of the reference clock RCLK with a phase of the first feedback clock FCLK to output a first phase comparison result signal to the first delay circuit 20A. The first delay circuit 20A outputs the rising clock RSCLK by adjusting the delay value of the reference clock RCLK in response to the first phase comparison result signal. The second phase comparator 30B compares a phase of the reference clock RCLK with a phase of the second feedback clock FB2 to output a second phase comparison result signal to the second delay circuit 20B. The second delay circuit 20B outputs the falling clock FACLK by adjusting the delay value of the reference clock RCLK in response to the second phase comparison result signal.

The phase comparison operations are performed until the phases of the clock signals RCLK and FOLK inputted to the first phase comparator 30A are equal to each other and the phases of the clock signals RCLK and FB2 inputted to the second phase comparator 30B are equal to each other. In addition, the first delay circuit 20A and the second delay circuit 20B output the rising clock RSCLK and the falling clock FACLK produced by locking the delay value of the reference clock RCLK in response to the control signals provided from the first phase comparator 30A and the second phase comparator 30B, respectively.

The mixing clock MIX produced by compensating the duty difference between the rising clock RSCLK and the falling clock FACLK is generated through the duty-correction mixer 50A, the dummy duty-correction mixer 50B, the mixer controller 60, and the duty-correction phase comparator 70 and then is inputted to the waveform separator 80A. The waveform separator 80A generates a rising DLL clock RDLL and a falling DLL clock FDLL by using the mixing clock MIX. The rising DLL clock RDLL is a clock synchronized with the rising edge of the mixing clock MIX, and the falling DLL clock FDLL is a clock synchronized with the falling edge of the mixing clock MIX. The dummy waveform separator 80B receives the dummy mixing clock DMIX from the dummy duty-correction mixer 50B. Although the dummy duty-correction mixer 50B and the dummy waveform separator 80B are not directly necessary to generate the rising and falling DLL clocks RDLL and FDLL, they are used to balance the load at locations where the rising clock RSCLK and the falling clock FACLK are inputted.

The first data strobe signal generator 90A generates a first data strobe signal DQS using the rising DLL clock RDLL, and the second data strobe signal generator 90B generates a second data strobe signal DQSB using the falling DLL clock FDLL. The data output buffer 10 receives an internal data IDATA provided from a memory core and outputs the internal data IDATA as an output data DATA in response to a transition of the rising and falling DLL clocks RDLL and FDLL.

As described above, the DDR synchronous memory device outputs data in response to the rising and falling edges of the system clocks CLK and CLKB. When the data output buffer 10 outputs data in response to the rising and falling edges of the system clocks CLK and CLKB, the data are outputted to the external circuit after a predetermined delay time because the system clocks CLK and CLKB are delayed by the predetermined delay time until they are transferred to the data output buffer 10. However, when the data output buffer 10 outputs the data in synchronization with the rising and falling DLL clocks RDLL and FDLL having the corrected delay time, the data are outputted to the external circuit while the system clocks CLK and CLKB are correctly synchronized with the transition timing.

As described above, the delay locking operation adjusts the delay values of the first delay circuit 20A and the second delay circuit 20B until the phases of the clocks RCLK and FLCK inputted to the first phase comparator 30A are equal to each other and the phases of the clocks RCLK and FB2 inputted to the second phase comparator 30B are equal to each other. In the state, referred to as a "delay locked state", the delay values of the first delay circuit 20A and the second delay circuit 20B are not changed any more because the phases of the clocks RCLK and FLCK inputted to the first phase comparator 30A are equal to each other and the phases of the clocks RCLK and FB2 inputted to the second phase comparator 30B are equal to each other. At this point, the rising clock RSCLK and the falling clock FACLK outputted from the first delay circuit 20A and the second delay circuit 20B pass through the duty-correction circuits and are finally outputted as the rising and falling DLL clocks RDLL and FDLL, respectively.

Figure 2:
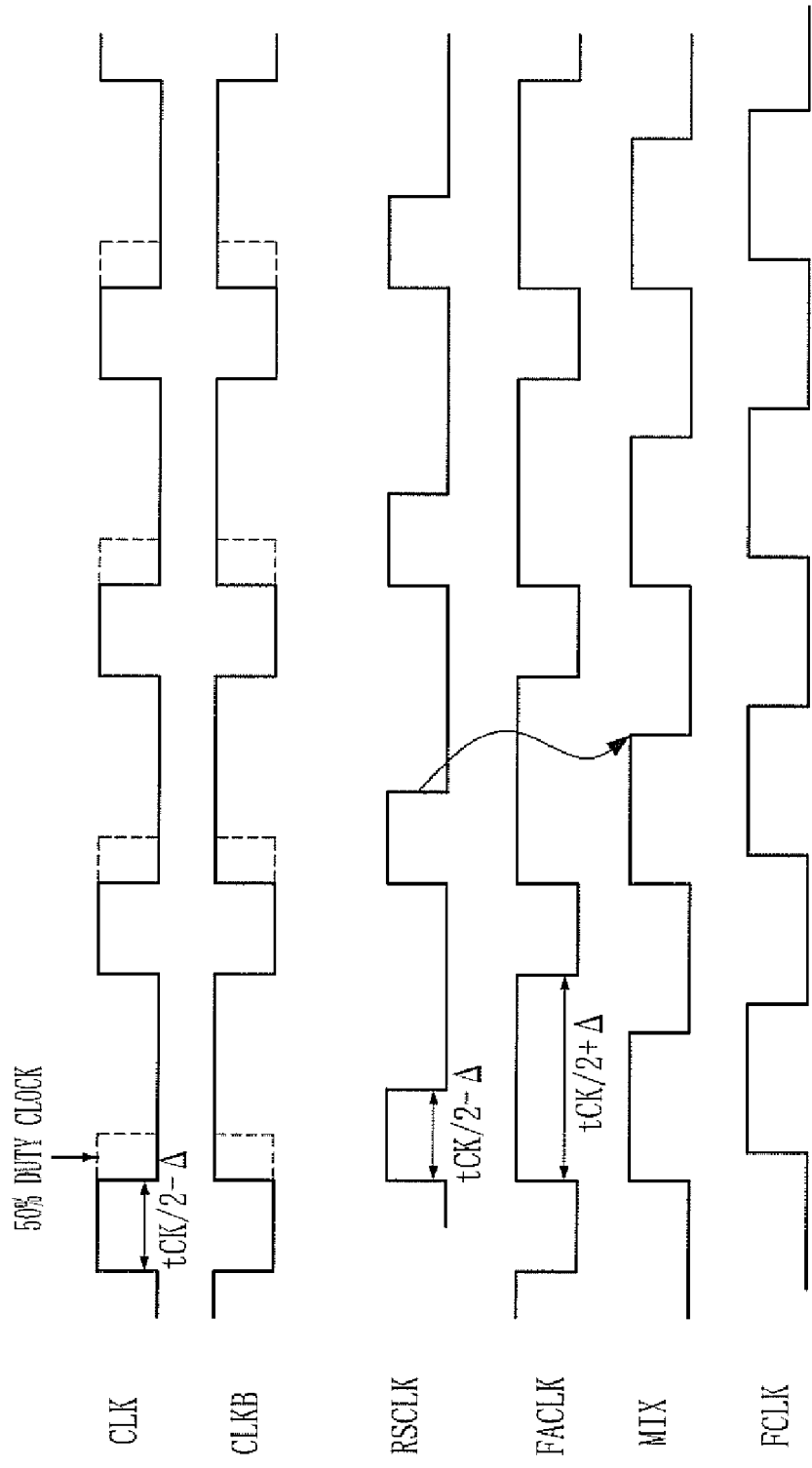
FIG. 2 is a waveform diagram illustrating a delay locking operation of the semiconductor memory device shown in FIG. 1.

FIG. 2 is a waveform diagram illustrating the delay locking operation of the semiconductor memory device shown in FIG. 1

Referring to FIG. 2, the clocks output after the delay locking operation are synchronized with the rising edges of the rising and falling clocks RSCLK and FACLK, but not synchronized with the falling edges of the rising and falling clocks RSCLK and FACLK. This is because the duty ratio of the inputted system clocks CLK and CLKB are not 50%.

Referring to FIG. 2, the mixing clock MIX having the duty ratio of 50% is generated using the rising and falling clocks RSCLK and FACLK through the duty-correction mixer 50A, the dummy duty-correction mixer 50B, the mixer controller 60, and the duty-correction phase comparator 70.

FIG. 3 is a circuit diagram of the duty-correction mixer 50A shown in FIG. 1.

Referring to FIG. 3, the duty-correction mixer 50A includes first to third inverters INV1, INV2 and INV3. The first and second inverters INV1 and INV2 are configured to receive the rising clock RSCLK and the falling clock FACLK, respectively. The third inverter INV3 is configured to receive output signals of the first and second inverters INV1 and INV2 to output the mixing clock MIX. A detailed circuit diagram of the first and second inverters INV1 and INV2 is shown on the lower side of FIG. 3. The mixer controller 60 generates duty-correction control signals HIGH and LOW for controlling the operations of the first and second inverters INV1 and INV2. Although transitions of the rising and falling clocks RSCLK and FACLK occur at the different timing as shown in FIG. 3, a transition of the mixing clock MIX occurs at a time between the transitions of the rising and falling clocks RSCLK and FACLK.

As described above, the rising and falling DLL clocks RDLL and FDLL are outputted as the data strobe signals DQS and DQSB through the first and second data strobe signal generators 90A and 90B. In addition, the data output buffer 10 receives the internal data IDATA from the memory core to output it as the output data DATA in synchronization with the rising and falling DLL clocks RDLL and FDLL.

The EMI characteristic may be degraded in view of the system if the output data and the data strobe signal always have the same frequency. To solve this problem, the system with the semiconductor memory device is designed to have a spread spectrum clock (SSC) function so as to implement a frequency modulation operation on output signals from the semiconductor memory device. However, if the SSC function of the system does not work well and thus the frequency modulation operation is not performed, the power spectrum of the system is concentrated on a single peak value due to the output signals from the semiconductor memory device, resulting in the degradation of the EMI characteristic. Accordingly, the present invention proposes a semiconductor memory device with a circuit block that can improve the EMI characteristic of the system.

Figure 4:
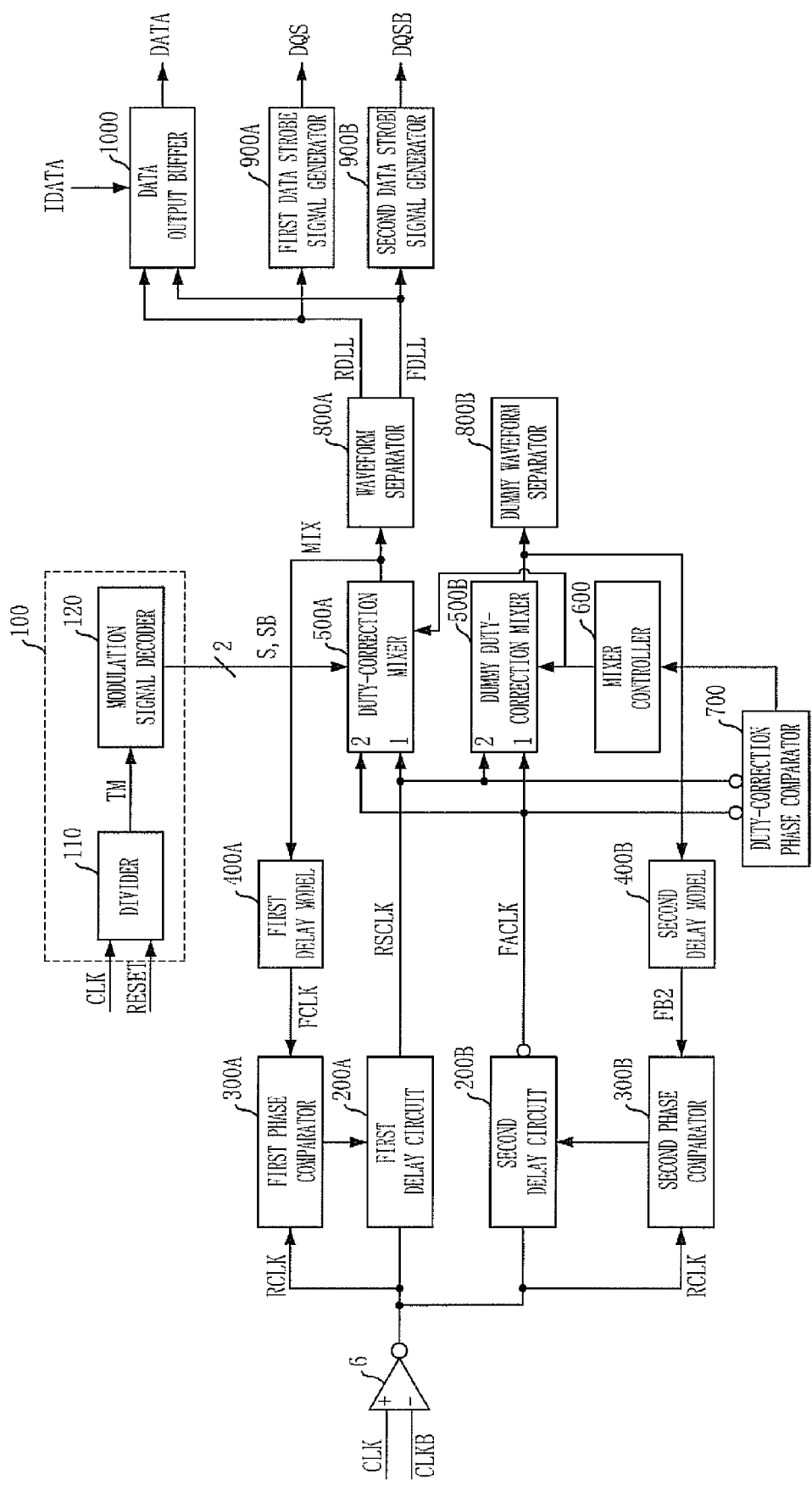
FIG. 4 is a block diagram of a semiconductor memory device in accordance with an embodiment of the present invention.

FIG. 4 is a block diagram of a semiconductor memory device in accordance with an embodiment of the present invention.

Referring to FIG. 4, the semiconductor memory device includes a clock input buffer 6, a modulation controller 100, a first delay circuit 200A, a second delay circuit 200B, a first phase comparator 300A, a second phase comparator 300B, a first delay model 400A, a second delay model 400B, a duty-correction mixer 500A, a dummy duty-correction mixer 500B, a mixer controller 600, a duty-correction phase comparator 700, a waveform separator 800A, a dummy waveform separator 800B, a first data strobe signal generator 900A, a second data strobe signal generator 900B, and a data output buffer 1000. The operations of the blocks for performing the delay locking operation to generate DLL clocks are substantially the same as those of the blocks shown in FIG. 1. A significant difference between the semiconductor memory device of FIG. 1 and the semiconductor memory device of FIG. 4 is that the duty-correction mixer 500A is controlled by the modulation controller 100.

The modulation controller 100 includes a divider 110 and a modulation signal decoder 120. The divider 110 divides an external system clock signal CLK to generate a modulation signal TM, and the modulation signal decoder 120 decodes the modulation signal TM to generate first and second decoding signals S and SB.

The duty-correction mixer 500A outputs a mixing clock MIX by correcting duty ratios of a rising clock RSCLK and a falling clock FACLK, which are outputted from the first delay circuit 200A and the second delay circuit 200B, respectively. Under the control of the modulation controller 100, the duty-correction mixer 500A outputs the mixing clock MIX as a frequency-modulated clock. The frequency-modulated clock represents a clock that is modulated within a predetermined frequency bandwidth. That is, the frequency modulation is to modulate an intended frequency of a clock delay-locked by a frequency bandwidth that can be modulated in order to improve the EMI characteristic of the system. Accordingly, it can be expected to improve the EMI characteristic, while meeting the frequency specification of the DLL clock.

The frequency-modulated mixing clock MIX passes through the waveform separator 800A and is outputted as data strobe signals DQS and DQSB through the data strobe signal generators 900A and 900B.

Figure 5:
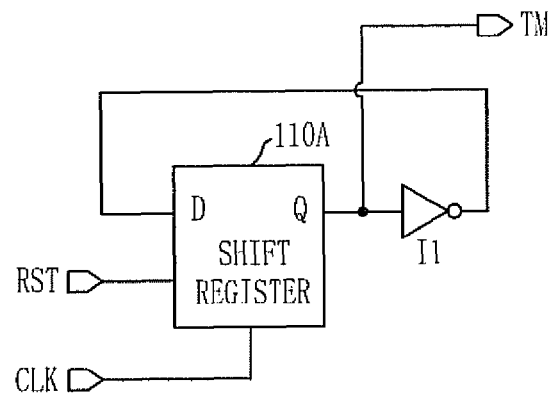
FIG. 5 is a circuit diagram of a divider shown in FIG. 4.

FIG. 5 is a circuit diagram of the divider 110 shown in FIG. 4.

Referring to FIG. 5, the divider 110 includes a shift register 110A and an inverter I1. The shift register 110A transfers an input signal D as an output signal Q in response to an intended number of transitions of the system clock CLK, and the inverter I1 inverts the output signal Q of the shift register 110A to output the inverted signal as the input signal D of the shift register 110A. The output signal Q of the shift register 110A is outputted to the modulation signal decoder 120.

Figure 6:
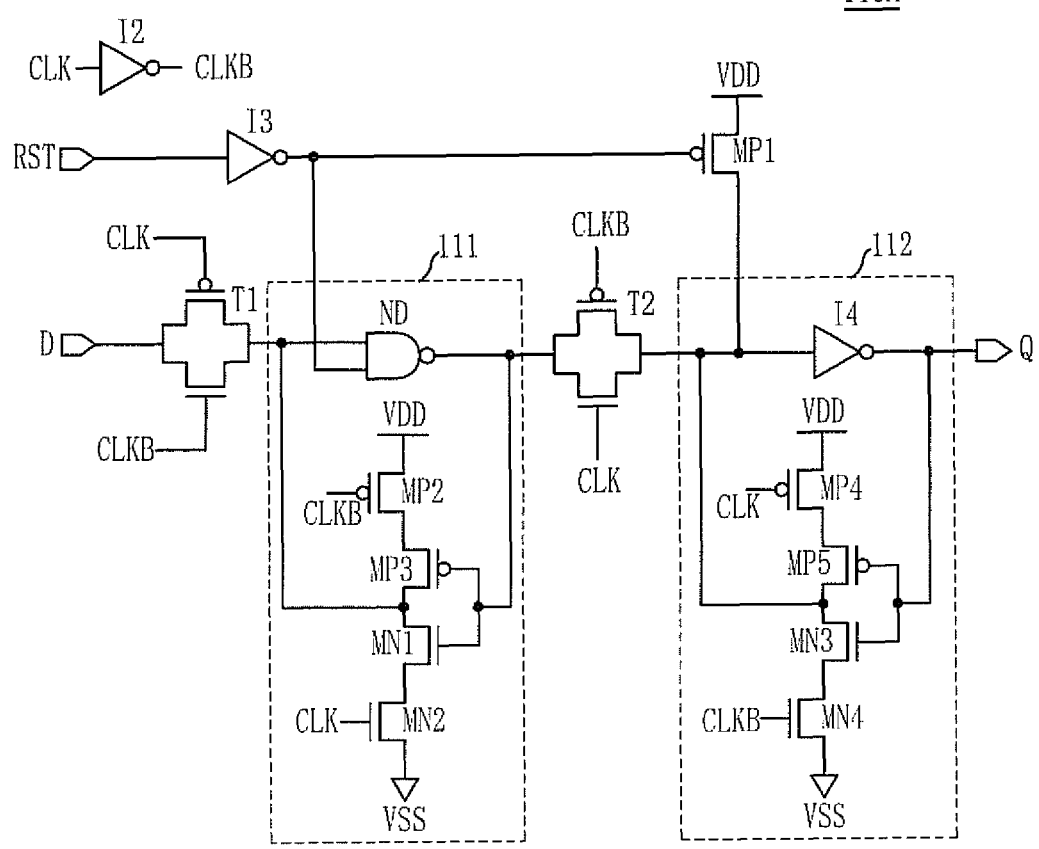
FIG. 6 is a circuit diagram of a shift register shown in FIG. 5.

FIG. 6 is a circuit diagram of the shift register 110A shown in FIG. 5.

Referring to FIG. 6, the shift register 110A includes a first transfer gate T1, a first latch 111, a second transfer gate T2, and a second latch 112. The first transfer gate T1 transfers the input signal D to the first latch 111 in response to the falling edge of the system clock CLK, and the first latch 111 latches an output signal of the first transfer gate T1 in response to the rising edge of the system clock CLK. The second transfer gate T2 transfers the latched signal of the first latch 111 to the second latch 112 in response to the rising edge of the system clock CLK, and the second latch 112 latches the output signal of the first transfer gate T1 in response to the falling edge of the system clock CLK.

Although the divided-by-2 system clock is used as the modulation system in FIG. 6, the divided-by-N system clock can also be used.

Figure 7:
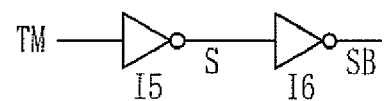
FIG. 7 is a circuit diagram of a modulation signal transmitter shown in FIG. 4.

FIG. 7 is a circuit diagram of the modulation signal decoder 120 shown in FIG. 4.

Referring to FIG. 7, the modulation signal decoder 120 includes first and second inverters I5 and I6. The first inverter I5 inverts the modulation signal TM to output the first decoding signal S, and the second inverter I6 inverts the first decoding signal S to output the second decoding signal SB.

Figure 8:
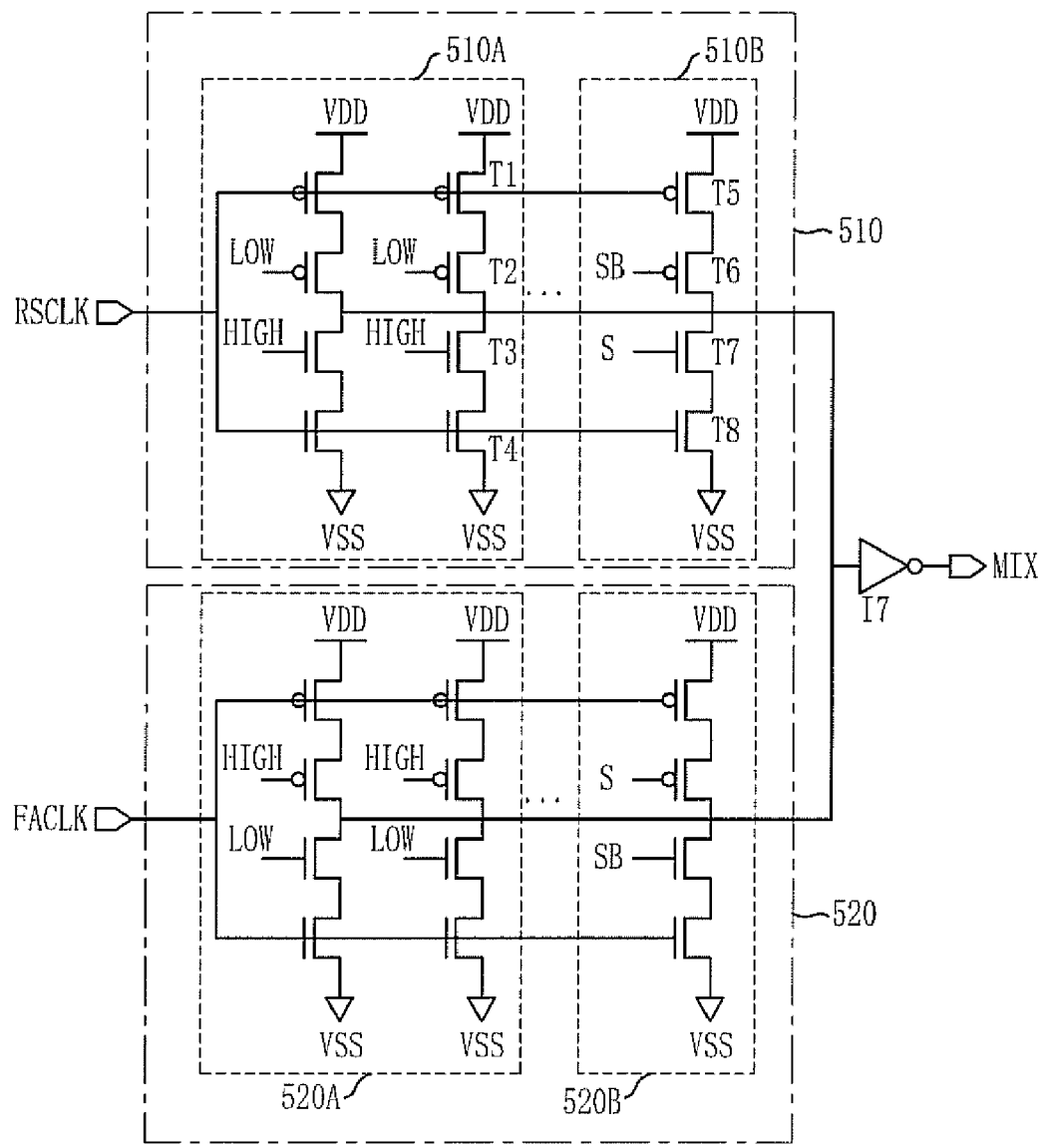
FIG. 8 is a circuit diagram of a duty correction mixer shown in FIG. 4.

FIG. 8 is a circuit diagram of the duty-correction mixer 500A shown in FIG. 4.

Referring to FIG. 8, the duty-correction mixer 500A includes a plurality of first inverters 510A, a plurality of second inverters 510B, a plurality of third inverters 520A, a plurality of fourth inverters 520B, and a fifth inverter I7. The first inverters 510A are arranged in parallel to invert the rising clock RSCLK outputted from the first delay circuit 200A in response to duty-correction control signals HIGH and LOW.

The second inverters 510B are arranged in parallel to invert the rising clock RSCLK in response to the first and second modulation decoding signals S and SB. The third inverters 520A are arranged in parallel to invert the falling signal FACLK output from the second delay circuit 200B in response to the duty-correction control signals HIGH and LOW. The fourth inverters 520B are arranged in parallel to invert the falling signal FACLK in response to the first and second modulation decoding signals S and SB. The fifth inverter I7 inverts output signals of the first to fourth inverters 510A, 510B, 520A and 520B. The duty-correction control signals HIGH and LOW are provided from the mixer controller 600. Although the second inverter 510B and the fourth inverter 520B each having only one inverter are shown in FIG. 8, they can also include a plurality of inverters.

Figure 9:
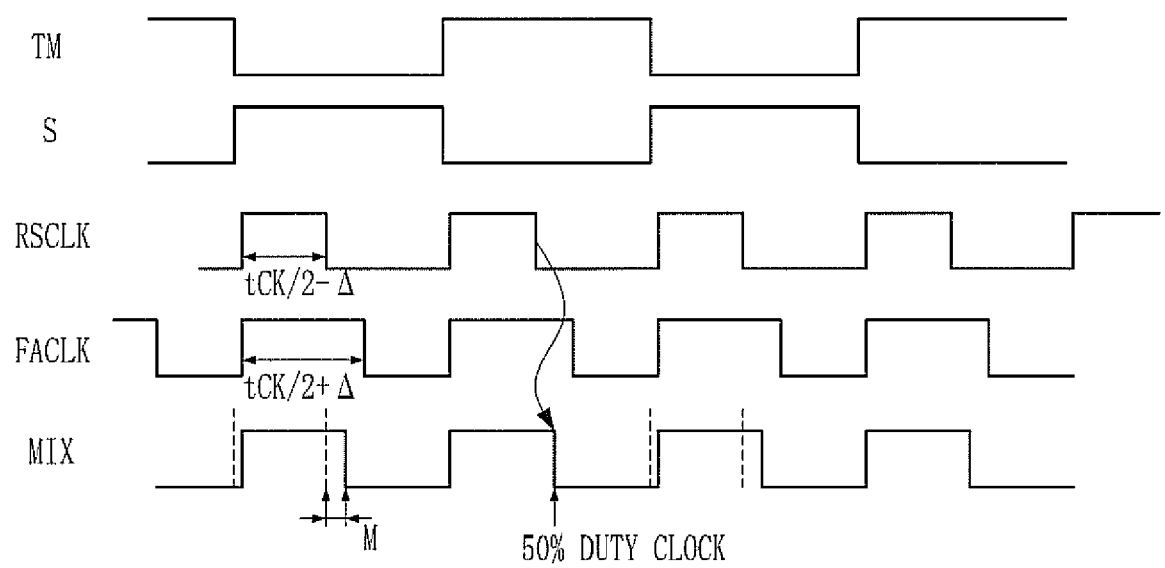
FIG. 9 is a waveform diagram illustrating a delay locking operation of the semiconductor memory device shown in FIG. 4.

FIG. 9 is a waveform diagram illustrating the delay locking operation of the semiconductor memory device shown in FIG. 4.

Referring to FIG. 9, the semiconductor memory device performs the frequency modulation operation in response to the first and second modulation decoding signals S and SB during the operation of adjusting the duty ratio of the DLL clocks. Therefore, the mixing clock MIX having the adjusted duty ratio is modulated within a predetermined range M. The data strobe signals DQS and DQSB finally generated using the mixing clock MIX are also frequency-modulated within the predetermined range M, and the data output from the data output buffer 1000 are also frequency-modulated. To modulate the data is not to output the successive data with the same frequency, but to output the data with variable frequencies within a predetermined range.

Figure 10:
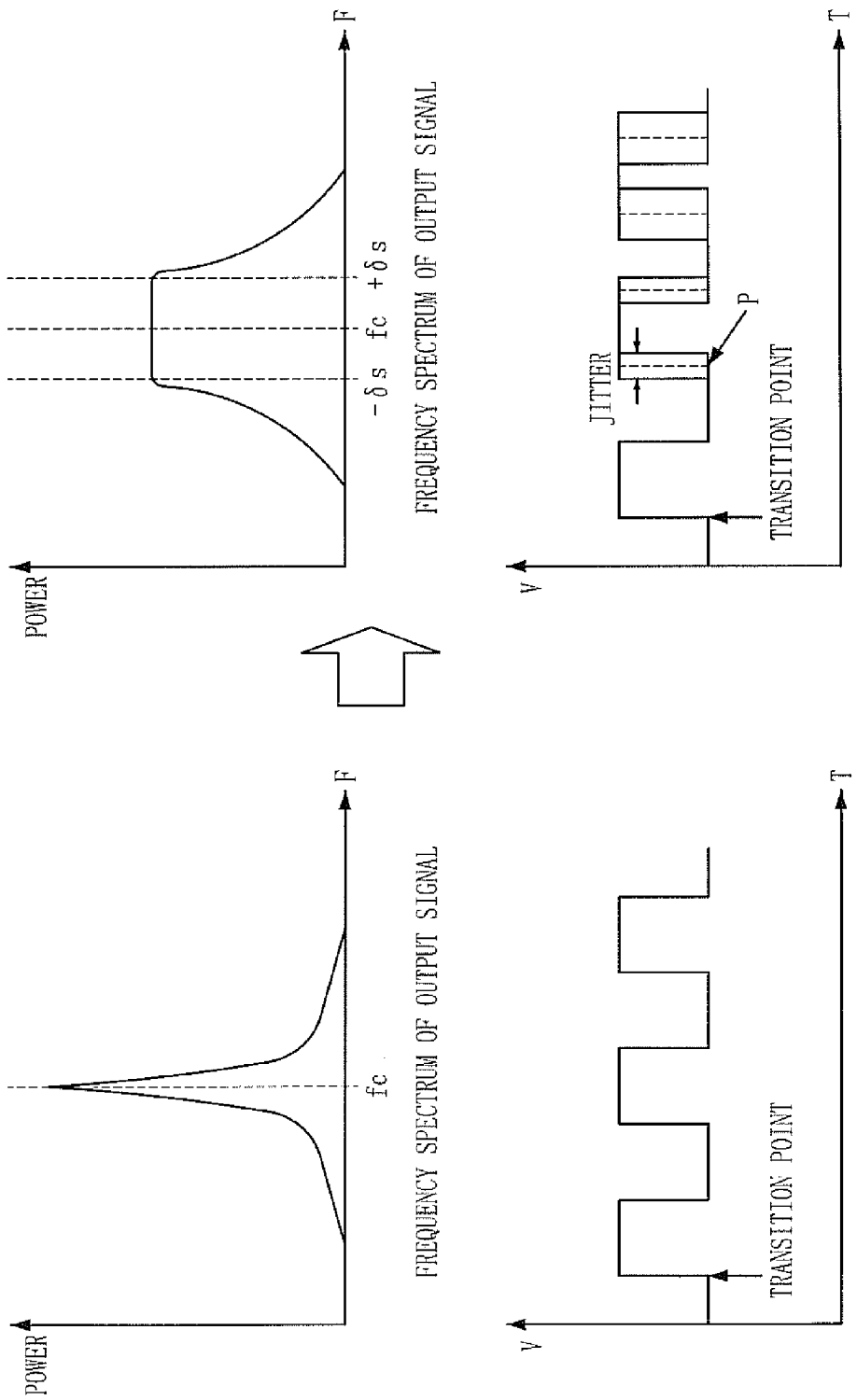
FIG. 10 is a waveform diagram illustrating an operation of the semiconductor memory device in accordance with the present invention.

FIG. 10 is a waveform diagram illustrating the operation of the semiconductor memory device in accordance with the embodiment of the present invention.

As shown on the left side of FIG. 10, the frequency spectrum of the output signal has a single peak when the semiconductor memory device outputs the data strobe signals and the data without the frequency modulation. In this case, the EMI characteristic of the system may be severely degraded.

Meanwhile, as shown in the right side of FIG. 10, the frequency spectrum of the output signal has no peak when the semiconductor memory device outputs the frequency-modulated signals. Therefore, the EMI characteristic of the system is not degraded.

Although the clock frequency output from the duty-correction circuit has been modulated in the embodiments of the present invention, a clock output circuit can be included which receives the clock from the DLL circuit and buffers the received clock, and a clock output from the clock output circuit is modulated.

In accordance with the present invention, the modulation of the clock output from the semiconductor memory device can be adjusted. Therefore, it can contribute to the improvement of the EMI characteristic in the system with the semiconductor memory device. Especially, the semiconductor memory device in accordance with the present invention is useful for the case where the clock modulation cannot be adjusted.

While the present invention has been described with respect to the specific embodiments, it will be apparent to those skilled in the art that various transpositions, changes, and modifications may be made without departing from the spirit and scope of the invention as defined in the following claims.

What is claimed is:

1. A semiconductor memory device, comprising:
   a delay locked loop (DLL) circuit for performing a delay locking operation to generate a DLL clock;

a modulation controller for generating a modulation control signal for controlling a frequency modulation operation;

a duty corrector for correcting a duty ratio of the DLL clock and outputting the DLL clock modulated in response to the modulation control signal; and a data strobe signal generator for outputting the modulated DLL clock as a data strobe signal.

2. The semiconductor memory device as recited in claim 1, wherein the DLL circuit includes:

a clock input buffer for buffering a clock signal to output a reference clock;

a first phase comparator for comparing a phase of the reference clock with a phase of a first feedback clock;

a first delay circuit for delaying the reference clock by a delay value corresponding to the result of comparison of the first phase comparator to output a first DLL clock;

a first delay model for delaying an output signal of the first delay circuit by a first model value to output the duty corrector;

second phase comparator for comparing a phase of the reference clock with a phase of a second feedback clock;

a second delay circuit for delaying the reference clock by a delay value corresponding to the result of comparison of the second phase comparator and inverting the delayed reference clock to output a second DLL lock; and a second delay model for delaying an output signal of the duty corrector by a second model value to output the second feedback clock.

3. The semiconductor memory device as recited in claim 2, wherein the modulation controller includes:

a divider for dividing a clock signal to output a divided clock signal; and a decoder for decoding the divided clock signal to output the modulation control signal.

4. The semiconductor memory device as recited in claim 3, wherein the divider includes:

a shift register for transferring an input signal as an output signal in response to a predetermined number of transitions of the clock signal; and an inverter for inverting the output signal of the shift register to output the inverted signal as the input signal of the shift register, wherein the output signal of the shift register is outputted to the decoder.

5. The semiconductor memory device as recited in claim 4, wherein the shift register includes:

a first transfer gate for transferring the input signal in response to a first transition of the clock signal;

a first latch for latching an output signal of the first transfer gate in response to a second transition of the clock signal;

a second transfer gate for transferring the latched signal of the first latch in response to the second transition of the clock signal; and a second latch for latching an output signal of the second transfer gate in response to the first transition of the clock signal.

6. The semiconductor memory device as recited in claim 2, wherein the duty corrector includes:

a duty-correction mixer for mixing the output signals of the first and second delay circuits in response to a duty correction control signal and the modulation control signal output from the modulation controller;

a dummy duty-correction mixer for mixing the output signals of the first and second delay circuits in response to the duty-correction control signal;

a duty-correction phase comparator for comparing a phase of the output signal of the first delay circuit with a phase of the output signal of the second delay circuit; and a mixer controller for generating the duty-correction control signal in response to the result of phase comparison of the duty-correction phase comparator.

7. The semiconductor memory device as recited in claim 6, wherein the duty-correction mixer includes:

a plurality of first inverters arranged in parallel to invert the output signal of the first delay circuit in response to the duty-correction control signal;

a plurality of second inverters arranged in parallel to invert the output signal of the first delay circuit in response to the modulation control signal;

a plurality of third inverters arranged in parallel to invert the output signal of the second delay circuit in response to the duty-correction control signal;

a plurality of fourth inverters arranged in parallel to invert the output signal of the second delay circuit in response to the modulation control signal; and a fifth inverter for inverting the output signals of the first to fourth inverters.

8. A method for driving a semiconductor memory device, comprising:

performing a delay locking operation to generate a delay locked loop (DLL) clock;

generating a frequency modulation control signal;

correcting a duty ratio of the DLL clock and frequency-modulating the DLL clock in response to the frequency modulation control signal; and outputting the modulated DLL clock as a data strobe signal.

9. The method as recited in claim 8, wherein the generating of the frequency modulation control signal includes:

dividing a clock signal to output a divided clock signal; and decoding the divided clock signal to generate the frequency modulation control signal.

* * * * *